United States Patent [19]
Sato et al.

[11] Patent Number: 5,960,256
[45] Date of Patent: Sep. 28, 1999

[54] WAFER LAYOUT OF SEMICONDUCTOR DEVICE AND MANUFACTURING METHOD THEREOF

[75] Inventors: Keiji Sato; Yutaka Saito, both of Chiba, Japan

[73] Assignee: SII R&D Center Inc., Japan

[21] Appl. No.: 08/962,399

[22] Filed: Oct. 31, 1997

Related U.S. Application Data

[62] Division of application No. 08/680,982, Jul. 16, 1996, Pat. No. 5,872,386.

[30] Foreign Application Priority Data

Jul. 17, 1995 [JP] Japan ..................................... 7-180332

[51] Int. Cl.⁶ .............................. G01R 31/26; H01L 21/66
[52] U.S. Cl. .................................................................. 438/14
[58] Field of Search ................................. 438/14, 27, 33, 438/68

[56] References Cited

U.S. PATENT DOCUMENTS

| | | | |
|---|---|---|---|
| 3,742,598 | 7/1973 | Nishida | 257/594 |
| 5,051,807 | 9/1991 | Morozumi | 257/620 |
| 5,262,668 | 11/1993 | Tu et al. | 257/594 X |
| 5,300,806 | 4/1994 | McClurg | 438/114 |
| 5,559,361 | 9/1996 | Pezzani | 257/601 |
| 5,561,317 | 10/1996 | Momma et al. | 257/620 |

*Primary Examiner*—John F. Niebling
*Assistant Examiner*—David A. Zarneke
*Attorney, Agent, or Firm*—Adams & Wilks

[57] ABSTRACT

A wafer layout for a multi-channel device for improving the yield of operative devices comprises a semiconductor wafer and a plurality of semiconductor devices formed in the semiconductor wafer, each device comprising a consecutive series of impurity regions formed in the semiconductor wafer, the impurity regions being arranged consecutively without separation between the respective semiconductor devices, such that each of the semiconductor devices is indistinguishable from the others, without regard to defective devices, and a single semiconductor device comprising a plurality of consecutive impurity regions formed in the semiconductor wafer may be cut from the wafer by cutting therefrom any of the plurality of consecutive impurity regions formed therein. The invention is particularly useful for the fabrication of strip diodes and the like.

19 Claims, 5 Drawing Sheets

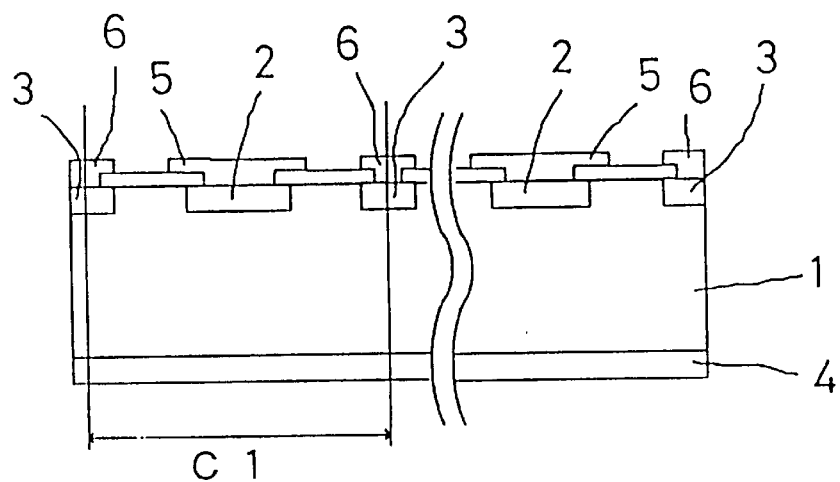
F I G. 3
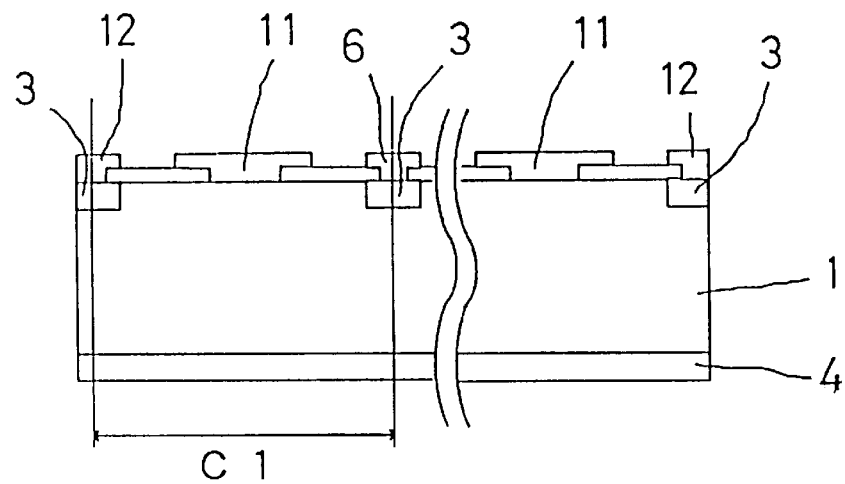
F I G. 4
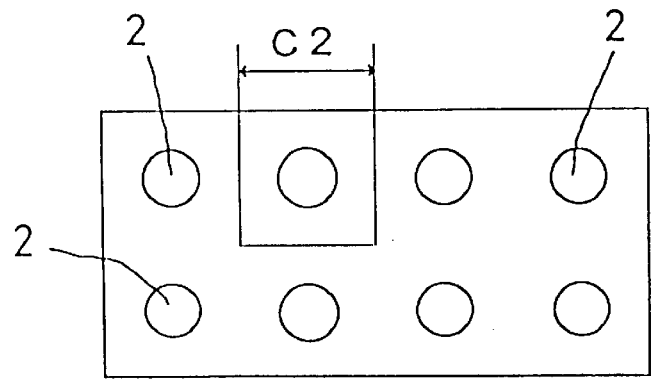
F I G. 5

WAFER LAYOUT OF SEMICONDUCTOR DEVICE AND MANUFACTURING METHOD THEREOF

This is a division of application Ser. No. 08/680,982 filed Jul. 16, 1996 now U.S. Pat. No. 5,872,386.

BACKGROUND OF THE INVENTION

The present invention relates to a semiconductor device having diode junctions and more particularly to a wafer layout of multi-channel diodes and a manufacturing method thereof.

DESCRIPTION OF RELATED ART

Heretofore, a semiconductor device in this field is fabricated as shown in a diagrammatic section view of FIG. 7 by forming a number of $P^+$-type impurity regions 2 and $N^+$-type impurity regions 3 on one surface of an N--type semiconductor substrate 1, forming an $N^+$-type impurity region 4 on the other surface (referred to as the back) of the substrate, and forming anode electrodes 5 on the $P^+$-type impurity regions 2 and cathode electrodes 6 on the $N^+$-type impurity regions 3, respectively. Diodes are formed by the $P^+$-type impurity regions 2 and the $N^-$-type region of the substrate.

It is noted that the cathode electrodes may be formed on the $N^+$-type impurity region 4 on the back.

FIG. 8 is a diagrammatic plan view showing the arrangement of the $P^+$-type impurity regions 2 of such a semiconductor device, wherein a large number of the $P^+$-type impurity regions 2 are formed, i.e. diodes are formed by the PN junctions, within one chip (one device).

Here, each part delimited by dotted lines and indicated by an arrow A in FIG. 7 or 8 corresponds to one channel and the entire device is referred to as a multi-channel diode, a diode array or a strip diode.

The multi-channel diode shown in FIG. 7 has a structure typical of a photodiode and is commonly used, as a photodiode or for a one-dimensional position transducer, a line sensor, an X-ray CT sensor, a light receiving element for fiber optic communication and the like, or for a two-dimensional radio sensor, a position transducer, and the like, by combining two of the diodes. The multi-channel diode is also used in a small-signal or a high-frequency circuit. While the N--type semiconductor substrate has been used in the example described above, the same concepts apply also to a multi-channel diode in which $N^+$-type impurity regions are formed on a P--type semiconductor substrate.

Furthermore, other than the PN junction, Schottky junction or similar devices may also be used for the diode.

Conventionally, a plurality of photoelectric conversion elements, i.e. a plurality of multi-channel diode devices 8, have been formed on a wafer 7 and are separated from each other as shown in a diagrammatic plan view of a device layout in FIG. 9.

When defective channels (10 indicated by shading) appear at this time, as shown in a diagrammatic plan view of a state of the defective channels in the device layout on the wafer in FIG. 10 for example, each device 8 composed of six channels may contain a defective channel 10. Thus, the yield becomes 0%, i.e. the yield is very bad.

Accordingly, it is an object of the present invention to improve the yield of the multi-channel diode.

SUMMARY OF THE INVENTION

In order to solve the aforementioned problem, according to a first aspect of the present invention, each channel of a plurality of multi-channel diodes is laid out areally uniformly on a wafer without physically separating each of the multi-channel diodes.

According to a second aspect of the present invention, each channel of a plurality of multi-channel diodes is formed areally uniformly on a wafer without separating each of the multi-channel diodes and a plurality of consecutive channels which correspond to one device, with the exception of defective channels, are cut out depending upon the location of defective channels detector through a post-wafer process inspection.

The first aspect of the present invention allows each one device to be obtained if there is no defective channel within a certain number of consecutive channels, thus improving the yield.

The second aspect of the present invention also allows devices having no defective channel produced in the wafer process to be obtained, thus improving the yield.

The above and other objects, features and advantages of the present invention will become more apparent in the following description and the accompanying drawings, in which like numerals refer to like parts.

BRIEF DESCRIPTION OF DRAWINGS

FIG. 3 is a diagrammatic section view showing a semiconductor device according to a second embodiment of the present invention;

FIG. 4 is a diagrammatic section view showing a semiconductor device according to a third embodiment of the present invention;

FIG. 5 is a diagrammatic plan view of $P^+$-type impurity regions in the semiconductor device of the second embodiment of the present invention;

DESCRIPTION OF PREFERRED EMBODIMENTS

Preferred embodiments of the present invention will be explained with reference to the drawings.

Figure 1:
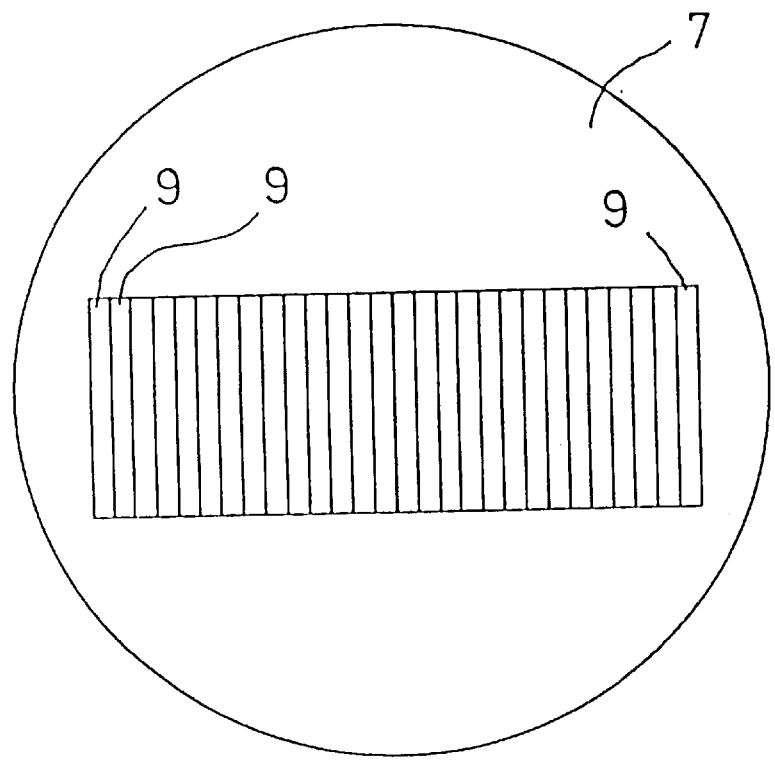
FIG. 1 is a diagrammatic plan view showing a wafer layout of semiconductor devices according to a first embodiment of the present invention.
Figure 7:
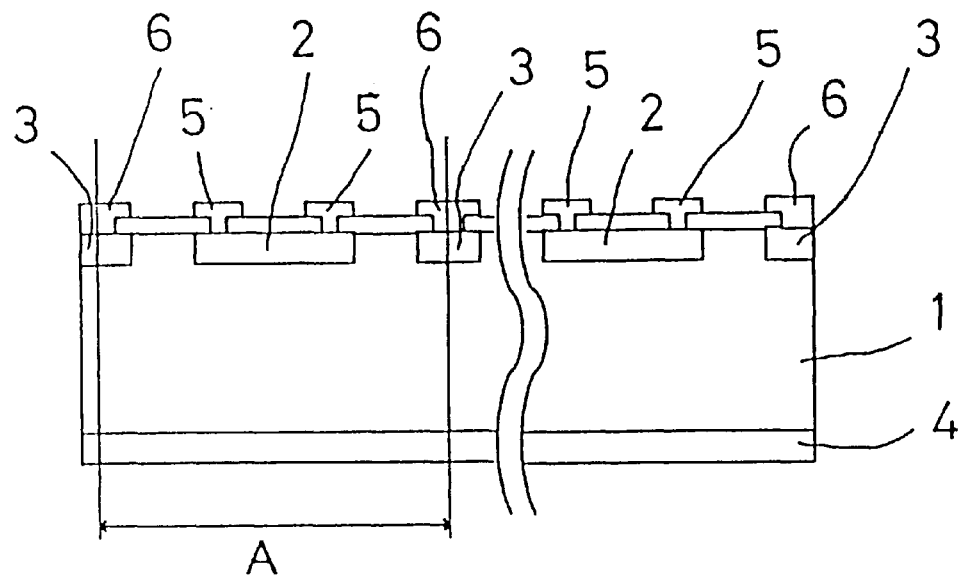
FIG. 7 is a diagrammatic section view showing a multi-channel diode.
Figure 8:
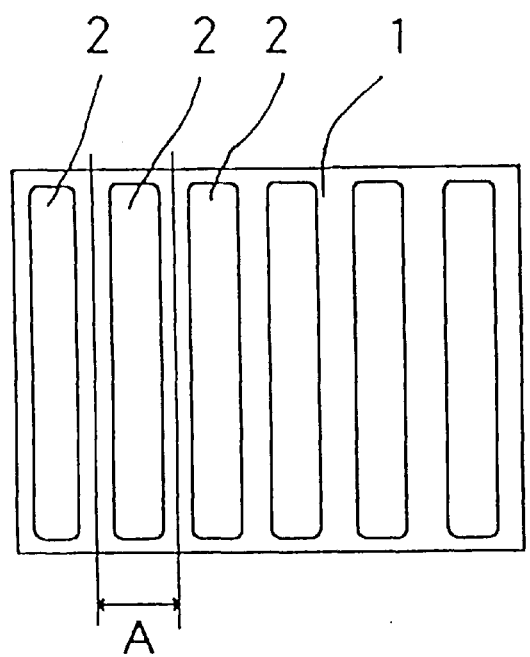
FIG. 8 is a diagrammatic plan view showing the layout of $P^+$-type impurity regions in a multi-channel diode.
Figure 9:
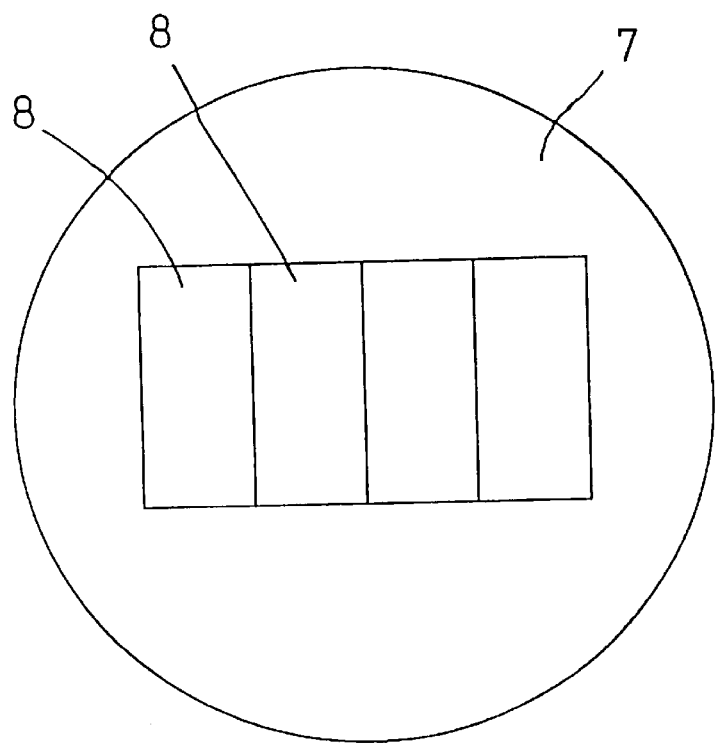
FIG. 9 is a diagrammatic plan view showing a prior art device layout on a wafer.
Figure 10:
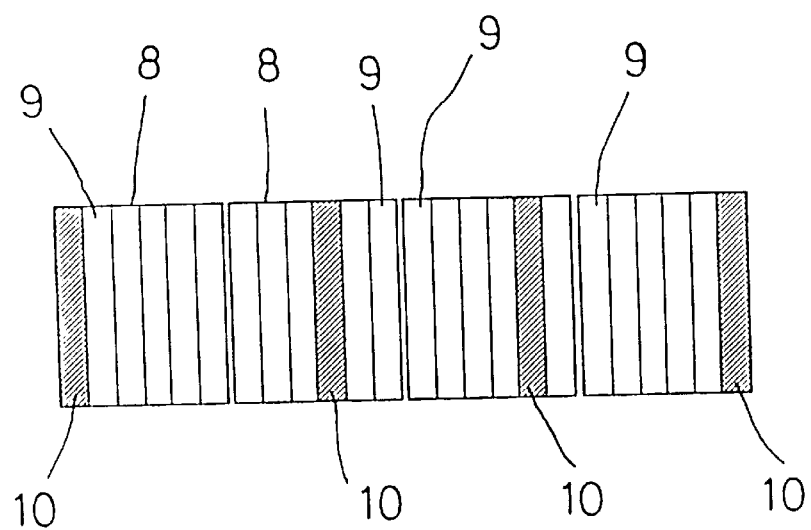
FIG. 10 is a diagrammatic plan view showing the location of defective channels in the prior art device layout on the wafer in FIG. 9.

FIG. 1 is a diagrammatic plan view showing a wafer layout of multi-channel photodiode semiconductor devices according to a first embodiment of the present invention, wherein a plurality of consecutive diodes are formed by a number of PN junctions of the type shown in the diagrammatic section view in FIG. 7 and in the diagrammatic plan view in FIG. 8 showing the arrangement of the P⁺-type impurity regions 2. Here, each part delimited by the dotted lines and indicated by the arrow A in FIG. 7 or 8 corresponds to 9 and the channels 9 are laid out on a wafer 7 uniformly without separation between each device.

Figure 2:
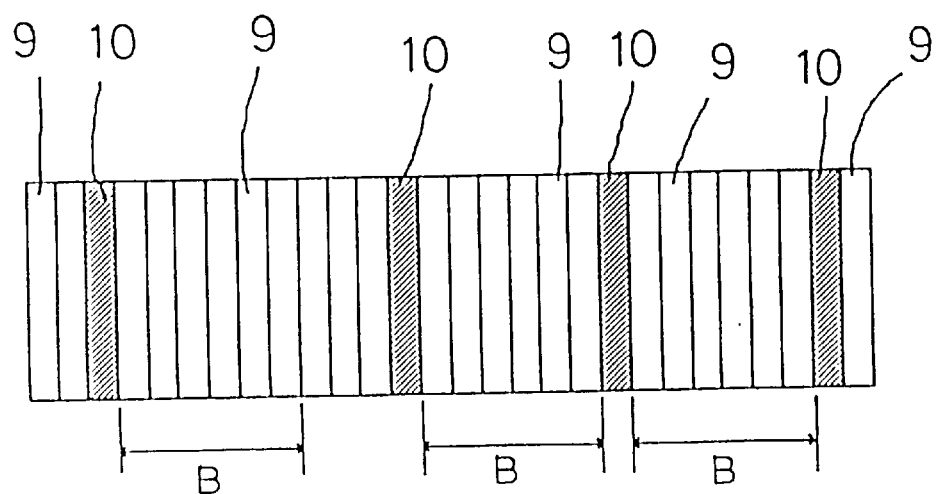
FIG. 2 is a diagrammatic section view showing the location of defective channels in the wafer layout of the semiconductor devices of the first embodiment of the present invention.

FIG. 2 is a diagrammatic section view showing a state of defective channels in the wafer layout of the semiconductor devices of the first embodiment of the present invention. Here, even if there are defective channels 10 as indicated by shading, three functional devices, each composed of six consecutive channels indicated by arrows B may be cut out, thus improving the yield to about 70%.

FIG. 3 is a diagrammatic section view showing a multi-channel diode semiconductor device for a small signal or high frequency circuit according to a second embodiment of the present invention and FIG. 4 is a diagrammatic section view showing a multi-channel Schottky diode semiconductor device according to a third embodiment of the present invention. The Schottky diode is formed by a Schottky metal 11 and an ohmic metal 12. Each part indicated by an arrow C in FIGS. 3 and 4 corresponds to one channel.

FIG. 5 is a diagrammatic plan view showing the arrangement of P⁺-type impurity regions 2 in one semiconductor device of the second embodiment of the present invention. Each part surrounded by dotted lines and indicated by an arrow C2 corresponds to one channel.

It is noted that the case of the multi-channel Schottky diode semiconductor device of the third embodiment of the present invention may be understood in the same way by replacing the P⁺-type impurity regions 2 with the Schottky junctions in the diagrammatic plan view in FIG. 5. The same applies also to the description below.

Figure 6:
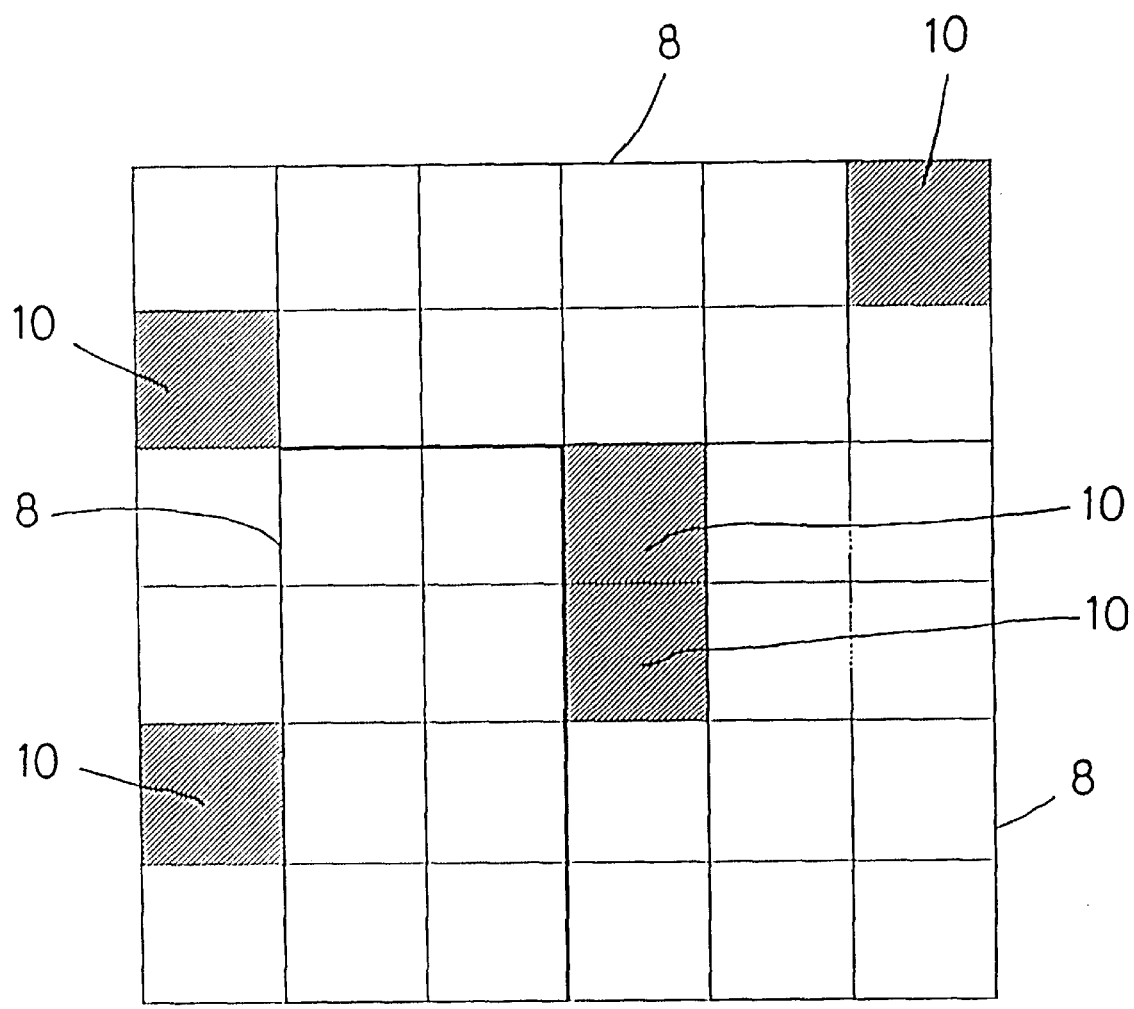
FIG. 6 is a diagrammatic plan view showing the location of defective channels in the wafer layout of the semiconductor device of the second embodiment of the present invention.

FIG. 6 is a diagrammatic plan view showing a state of defective channels in the wafer layout of the semiconductor devices of the second embodiment of the present invention. Here, three devices (three chips) each composed of consecutive eight channels 8 in an area shown by solid lines may be cut out except of defective channels 10 shown by shading, thus improving the yield to about 70%.

It is noted that the eight channels should be selected by taking into consideration the difficulty of cutting out the devices at this time.

As described above, the inventive method allows the yield of the multi-channel diode to be improved.

While preferred embodiments have been described, variations thereto will occur to those skilled in the art within the scope of the present inventive concepts which are delineated by the following claims.

What is claimed is:

1. A method of manufacturing multi-channel diode semiconductor devices each having a predetermined plurality of individual diodes, comprising the steps of:
   providing a semiconductor wafer;
   forming multi-channel diode semiconductor devices in the semiconductor wafer without separation between adjacent multi-channel diode semiconductor devices such that the physical boundaries of any consecutive predetermined plurality of individual diodes may serve as the physical boundaries of a respective multi-channel diode semiconductor device;
   inspecting the diodes to determine the location of defective diodes; and
   cutting out at least one predetermined plurality of consecutive diodes from the semiconductor wafer to form a respective multi-channel diode semiconductor device.

2. A method of manufacturing multi-channel diode semiconductor devices according to claim 1; wherein the semiconductor wafer has a first conductivity type; and the step of forming the multi-channel diode semiconductor devices comprises the steps of forming a plurality of first impurity regions having a second conductivity type in a regular pattern in a first surface of the semiconductor wafer, forming a plurality of second impurity regions having the first conductivity type in the first surface of the semiconductor wafer, each second impurity region being formed adjacent a first impurity region such that the first and second impurity regions are formed in pairs having a regular pattern, forming a plurality of first electrodes over the first impurity regions, forming a plurality of second electrodes over the second impurity regions, and forming a third impurity region in a second surface of the semiconductor wafer.

3. A method of manufacturing multi-channel diode semiconductor devices according to claim 1; wherein the multi-channel diode semiconductor devices comprise photodiodes.

4. A method of manufacturing multi-channel diode semiconductor devices according to claim 1; wherein the multi-channel diode semiconductor devices comprise position transducers.

5. A method of manufacturing multi-channel diode semiconductor devices according to claim 1; wherein the multi-channel diode semiconductor devices comprise line sensors.

6. A method of manufacturing multi-channel diode semiconductor devices according to claim 1; wherein the multi-channel diode semiconductor devices comprise X-ray CT sensors.

7. A method of manufacturing multi-channel diode semiconductor devices according to claim 1; wherein the multi-channel diode semiconductor devices comprise Schottky diodes.

8. A method of manufacturing multi-channel diode semiconductor devices according to claim 1; wherein the multi-channel diode semiconductor devices comprise light receiving elements.

9. A method of manufacturing multi-channel diode semiconductor devices according to claim 1; wherein the multi-channel diode semiconductor devices comprise radio sensors.

10. A method of manufacturing semiconductor devices, comprising the steps of:
    providing a semiconductor wafer;
    forming a plurality of semiconductor devices in the semiconductor wafer, each semiconductor device comprising a consecutive predetermined plurality of impurity regions formed in the semiconductor wafer, the impurity regions being arranged consecutively without separation between the respective semiconductor devices, such that the physical boundaries of any consecutive predetermined plurality of individual impurity regions may serve as the physical boundaries of a respective semiconductor device;
    inspecting the semiconductor devices to determine the location of defective device elements; and
    cutting out at least one predetermined plurality of consecutive impurity regions from the semiconductor wafer to form a respective semiconductor device.

11. A method of manufacturing semiconductor devices according to claim 10; wherein the semiconductor wafer has a first conductivity type, and the step of forming the plurality of semiconductor devices includes the steps of forming a plurality of first impurity regions having a second conductivity type in a regular pattern in a first surface of the semiconductor wafer, forming a plurality of second impurity regions having the first conductivity type in the first surface of the semiconductor wafer, each second impurity region being formed adjacent a first impurity region such that the first and second impurity regions are formed in pairs having a regular pattern, forming a plurality of first electrodes over the first impurity regions, forming a plurality of second electrodes over the second impurity regions, and forming a third impurity region in a second surface of the semiconductor wafer.

12. A method of manufacturing semiconductor devices according to claim 10; wherein the semiconductor devices comprise multi-channel diodes.

13. A method of manufacturing semiconductor devices according to claim 10; wherein the semiconductor devices comprise photodiodes.

14. A method of manufacturing semiconductor devices according to claim 10; wherein the semiconductor devices comprise position transducers.

15. A method of manufacturing semiconductor devices according to claim 10; wherein the semiconductor devices comprise line sensors.

16. A method of manufacturing semiconductor devices according to claim 10; wherein the semiconductor devices comprise X-ray CT sensors.

17. A method of manufacturing semiconductor devices according to claim 10; wherein the semiconductor devices comprise Schottky diodes.

18. A method of manufacturing semiconductor devices according to claim 10; wherein the semiconductor devices comprise light receiving elements.

19. A method of manufacturing semiconductor devices; according to claim 10; wherein the semiconductor devices comprise radio sensors.

* * * * *